United States Patent
Padhye et al.

(10) Patent No.: US 7,138,842 B2
(45) Date of Patent: Nov. 21, 2006

(54) FLIP-FLOP CIRCUIT HAVING LOW POWER DATA RETENTION

(75) Inventors: Milind P. Padhye, Austin, TX (US); Yuan A. Yuan, Austin, TX (US); Mahbub M. Rashed, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 53 days.

(21) Appl. No.: 11/097,659

(22) Filed: Apr. 1, 2005

(65) Prior Publication Data

US 2006/0220717 A1 Oct. 5, 2006

(51) Int. Cl.
*H03K 3/289* (2006.01)

(52) U.S. Cl. .................. 327/203; 327/208; 327/218

(58) Field of Classification Search ............. 327/202, 327/203, 218
See application file for complete search history.

(56) References Cited

U.S. PATENT DOCUMENTS

| | | | | |
|---|---|---|---|---|
| 6,492,854 B1 | 12/2002 | Ku | .............. | 327/202 |
| 6,870,412 B1* | 3/2005 | Cho | .............. | 327/202 |
| 6,873,197 B1* | 3/2005 | Kanba | ............ | 327/202 |
| 2004/0075479 A1* | 4/2004 | Gupta | ............ | 327/202 |
| 2004/0090256 A1 | 5/2004 | Cho | .............. | 327/202 |

* cited by examiner

*Primary Examiner*—Long Nguyen
(74) *Attorney, Agent, or Firm*—James L. Clingan, Jr.; Daniel D. Hill

(57) ABSTRACT

A flip-flop (10) comprises a first latch circuit (18), a second latch circuit (24), and a third latch circuit (26). The first latch circuit (18) is coupled to receive a clock signal and a first power supply voltage. The second latch circuit (24) is coupled to the first latch circuit (18) and receives the clock signal and the first power supply voltage. Preparatory to entering a low power mode, the third latch circuit (26) receives a second power supply voltage and is coupled to the second latch circuit (24) in response to a power down signal. During the low power mode, the first power supply voltage is removed from the first and second latch circuits (18, 24). When returning to a normal operating mode, the first power supply voltage is provided to the first and second latch circuits (18, 24), and the third latch circuit (26) is coupled to the first latch circuit (18) in response to a power restore signal.

20 Claims, 2 Drawing Sheets

FLIP-FLOP CIRCUIT HAVING LOW POWER DATA RETENTION

RELATED APPLICATION

A related, copending application titled "Flip-Flop Circuit having Low Power Data Retention", by Padhye et al., Ser. No. 11/097,658, is assigned to the assignee hereof, and filed concurrently herewith;

a related, copending application titled "State Retention Within a Data Processing System", by Padhye et al., Ser. No. 10/819,383, filed Apr. 6, 2004, is assigned to the assignee hereof, and filed concurrently herewith; and a related, copending application titled "State Retention Within a Data Processing System", by Padhye et al., Ser. No. 10/818,861, filed Apr. 6, 2004, is assigned to the assignee hereof, and filed concurrently herewith;

FIELD OF THE INVENTION

This invention relates generally to integrated circuits, and more particularly to a flip-flop circuit with low power data retention.

RELATED ART

Lower power consumption has been gaining importance in integrated circuit data processing systems due to, for example, wide spread use of portable and handheld applications. Most circuits in handheld devices are typically off (e.g., in an idle or deep sleep mode) for a significant portion of time, consuming only leakage power. As transistor leakage currents increase with finer geometry manufacturing processes, it becomes more difficult to meet chip leakage targets using traditional power reduction techniques. Therefore, reducing leakage current is becoming an increasingly important factor in extending battery life.

One method that has been used to reduce leakage current of integrated circuits is to increase the threshold voltage of the transistors in the device. However, simply increasing the threshold voltage of the transistors may result in unwanted consequences such as slowing the operating speed of the device and limiting circuit performance.

Another method that has been used to reduce leakage current is to "power gate", or cut off power to certain blocks of the integrated circuit that are not need when the device has been in a low power mode. However, in doing so, the state of the circuit block is lost. In many circuit blocks state retention is needed in order to prevent loss of important information and allow for proper circuit operation and performance when recovering from a low power mode. Therefore, a need exists for improved circuitry and methods for state retention during, for example, idle or deep sleep modes, which may therefore help in reducing leakage power and extending battery life.

BRIEF DESCRIPTION OF THE DRAWINGS

The present invention is illustrated by way of example, and not by way of limitation, in the figures of the accompanying drawings and in which like reference numerals refer to like elements and in which.

DESCRIPTION OF A PREFERRED EMBODIMENT

Generally, in one aspect, the present invention provides a flip-flop circuit that retains its state in a low leakage latch during a low power mode. The flip-flop includes a master latch, a slave latch, and the low-leakage latch. The master and slave latches are coupled to receive a power supply voltage that is removed during the low power mode. The low-leakage latch receives a power supply voltage that is maintained during the low power mode. The master latches latch an input signal during a normal operating mode but are non-functional in response to entering the low power mode.

The low-leakage latch has an output terminal coupled to the master latch via a transmission gate and an input terminal coupled to the slave latch. The low-leakage latch stores the logic state of a signal that was received from the slave latch during the normal operating mode, and maintains the latched logic state during the low power mode. Power is then removed from the master and slave latches during the low power operating mode. The latching by the low-leakage latch occurs in response to a pulse received in response to entering the low power mode. The logic state stored in the low-leakage latch is coupled to the master latch and on to the slave latch upon resuming normal power mode in response to another pulse. During normal operation, the low-leakage latch logic does not cause a logic path delay because it is not in a "critical path", that is, the input to data output path, of the integrated circuit. The low-leakage latch is not used when the flip-flop is operating in a normal mode.

Figure 1:
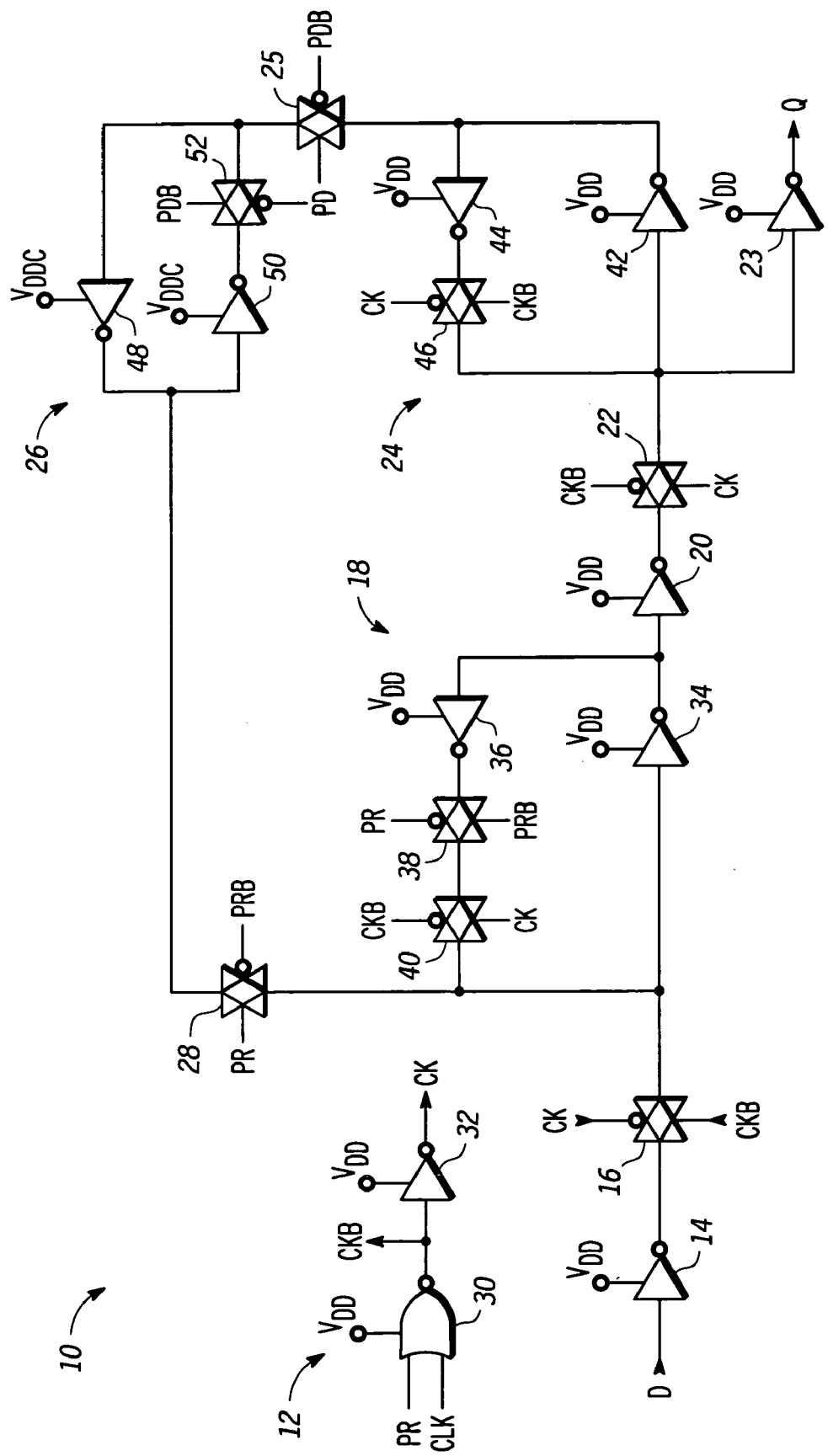
FIG. 1 illustrates, in logic diagram form, a flip-flop circuit in accordance with one embodiment of the present invention.

Shown in FIG. 1 is a flip-flop circuit 10 comprising a clock circuit 12, an inverter 14, a transmission gate 16, a master latch 18, an inverter 20, a transmission gate 22, an inverter 23, a slave latch 24, a transmission gate 25, a low-leakage latch 26, and a transmission gate 28. Clock circuit 12 comprises a NOR gate (this can be an equivalent NOR gate logic implementation) 30 and an inverter 32. Master latch 18 comprises an inverter 34, an inverter 36, an transmission gate 38, and a transmission gate 40. Slave latch 24 comprises inverter 42, an inverter 44, and a transmission gate 46. Low-leakage latch 26 comprises an inverter 48, a transmission gate 50, and a transmission gate 52. Flip-flop circuit 10 is exemplary of many flip-flops present on an integrated circuit.

Clock circuit 12 is connected in the manner of the following description. Nor gate 30 has a first input for receiving an input clock signal CLK, a second input for receiving a power restore pulse PR, and an output for providing a latch clock signal CKB. Inverter 32 has an input coupled to the output of NOR gate 30 and an output for providing a latch clock signal CK. In normal operation, when input clock CLK is providing regular clock pulses, latch clock signal CKB is complementary to latch clock signal CK and to input clock CLK. Clock circuit 12 is considered part of flip-flop circuit 10 because its latch clock signals CK and CKB are received by different portions of flip-flop circuit 10 but may also provide clock outputs to other flip-flops and be considered part of those flip-flops as well.

The remaining portion flip-flop circuit 10 is connected in the manner of the following description. Inverter 14 has an input for receiving a data signal D and an output. Transmission gate 16 has a first data terminal coupled to the output of inverter 14, an inverting enable input for receiving latch clock signal CK, a non-inverting enable input for receiving latch clock signal CKB, and a second data terminal. Inverter 34 has an input connected to the second data terminal of transmission gate 16, and an output. The input of inverter 34 acts as an input of latch 18, the output of inverter 34 acts as the output of latch 18. Inverter 36 has an input connected to the output of inverter 34, and an output. Transmission gate 38 has a first data terminal connected to the output of inverter 36, an inverting enable input for receiving power restore pulse PR, a non-inverting enable input for receiving a complementary power restore pulse PRB, and a second data terminal. Transmission gate 40 has a first data terminal coupled to the second data terminal of transmission gate 38, an inverting enable input for receiving latch clock signal CKB, a non-inverting enable input for receiving latch clock signal CK, and a second data terminal connected to the input of inverter 34. Inverter 20 has an input coupled to the output of inverter 34, which is also the output of latch 18, and an output coupled to an input of latch 24. When data is latched in latch 18, as is typical of latches, the data, though complementary, is stored at both the input and output of latch 18.

Inverter 23 has an input connected to the output of transmission gate 22 and an output for providing an output signal Q of flip-flop 10. Inverter 42 has an input, which is an input of latch 24, connected to the output of transmission gate 22 and an output, which is an output of latch 24. Inverter 44 has an input connected to the output of inverter 42 and an output. Transmission gate has a first data terminal connected to the output of inverter 44, an inverting enable input for receiving latch clock signal CK, a non-inverting input for receiving latch clock signal CKB, and a second data terminal connected to the input of inverter 42. Transmission gate 25 has a first data terminal connected to the output of latch 24, which is also the output of inverter 42, an inverting enable input for receiving a power-down signal PD, a non-inverting input for receiving a complementary power-down signal PDB, and a second data terminal connected to an input of latch 26. Inverter 48 has an input, which is the input of latch 26, connected to the second data terminal of transmission gate 25 and an output, which is also the output of latch 26. Inverter 50 has an input connected to the output of inverter 48 and an output. Transmission gate 52 has a first data terminal connected to the output of inverter 50, an inverting enable input for receiving power-down signal PD, a non-inverting input for receiving complementary power-down signal PDB, and a second data terminal connected to the input of inverter 48. Transmission gate 28 has a first data terminal connected to the output of latch 26 which is also the output of inverter 48, an inverting enable input for receiving power restore signal PRB, a non-inverting input for receiving complementary power-down signal PR, and a second data terminal connected to the input of inverter 34 which is also the input of latch 18.

Inverters 14, 34, 20, 23, 32, 36, 42, and 44 and NOR gate 30 are powered by a voltage VDD whereas inverters 48 and 50 are powered by a voltage VDDC. During a power down mode, voltage VDD is removed so that inverters 14, 34, 20, 23, 32, 36, 42, and 44 are not operational. Inverters 48 and 50 are made to be low-leakage devices. In this example, they have lower leakage than inverters 14, 34, 20, 23, 32, 36, 42, and 44 because the transistors that are used for inverters 48 and 50 have a higher threshold voltage. In this example, the higher threshold voltage is achieved by having a thicker gate dielectric for inverters 48 and 50 than for the transistors of inverters 14, 34, 20, 23, 32, 36, 42, and 44. Further, but not shown in FIG. 2, are inverters that generate signals PR and PRB that are powered by voltage VDDC.

Figure 2:
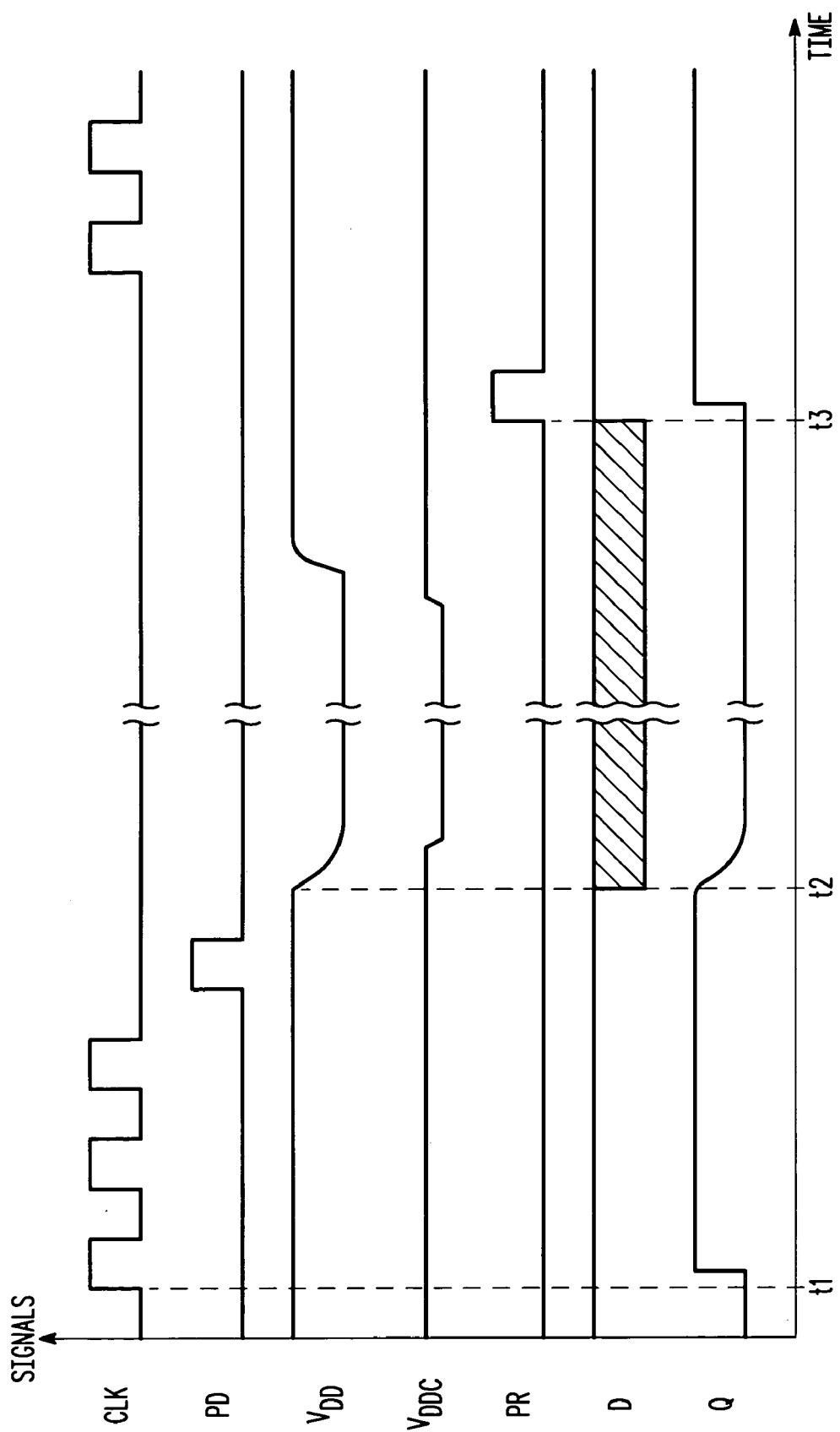
FIG. 2 illustrates a timing diagram of various signals of the flip-flop circuit of FIG. 1.

As shown in FIG. 2, a power down mode begins by stopping input clock signal CLK. After this, power-down pulse PD occurs. This is followed by VDD being removed. Voltage VDDC, on the other hand remains high enough to operate inverters 48 and 50. VDDC is shown as being at level comparable to VDD prior to power down and then dropping slightly during power down. An alternative is for VDDC to be at or near ground, zero volts, prior to power down and then being raised to the level sufficient to power inverters 48 and 50 during power down. A power restore mode begins by restoring the voltage level of VDD. This is followed by the power restore pulse PR. After power restore pulse PR has occurred, input CLK commences normal operation.

During normal operation latch clock signal CK and input clock CLK are essentially the same. During normal operation, which is shown as being during the first three clock pulses of input clock CLK of FIG. 1, transmission gate 16 couples the inversion of data signal D to latch 18 when latch clock signal CK is low. Transmission gate 22, on the other hand is non-conducting, which blocks the output of latch 18 from reaching the input of latch 24. When latch clock signal CK switches high, transmission gate 16 becomes non-conductive, and transmission gates 22 and 38 become conductive. Transmission gate 38 is continuously conductive during normal operation with power restore pulse PR being low. Transmission gates 25 and 28 are continuously non-conductive during normal operation, and transmission gate 52 is continuously conductive. With latch clock signal CK high, latch 18 latches the logic state that it had been receiving at the time latch clock signal CK switched from low to high. Inverter 20 then provides the inversion of the latched logic state to inverters 23 and 42 through transmission gate 22. In this clock high condition, master latch 18 effectively controls the logic state of output Q by the latched logic state in latch 18. When latch clock signal CK switches back low, slave latch 24 latches the data that was being provided by latch 18 so that inverter 23 continues to output the same data. The latching of latch 24 is achieved by transmission gate 24 becoming conductive. With latch clock signal CK being low, data into latch 18 is updated from signal D through inverter 14 and transmission gate 16. When latch clock signal CK switches back high, latch 18 latches the updated data and output signal Q is updated according to the data latched in latch 18. The next clock switch again latches the data in latch 24 to continue to provide the latest updated data as output signal Q while latch 18 receives the next update of data signal D. In the example shown in FIG. 2, data signal D does not change during the three clock pulse so that signal Q also does not change. Thus, it is seen that flip-flop 10 achieves typical master/slave operation during normal operation.

For entering power down, in which power is removed from the fast but high-leakage devices, latch 26 is used to store the last valid logic state of latch 24. Power down begins by stopping input clock CLK which has the effect of bringing latch clock signal CK to a logic low. This in turn has the effect of causing transmission gate 22 to be non-conductive and transmission gate 46 to be conductive, thereby latching the latest data in latch 24. The next step is for power-down pulse PD become active by switching to a logic high for about the same time as input clock CK is high in one cycle. With power-down pulse PD active, transmission gate 25 becomes conductive and transmission gate 52 becomes non-conductive, coupling the logic state of latch 24 into latch 26. When power-down pulse PD switches back to an inactive state, transmission gate 25 becomes non-conductive and transmission gate 52 becomes conductive to cause latch 26 to latch the logic state latched in latch 24. With the latest data latched in latch 26, voltage VDD can be removed. Voltage VDDC remains high enough for latch 26 to retain the data that it is storing. With VDD being removed, data signal D becomes indeterminate and output signal Q decays to a logic low. In this condition, flip-flop 10 is receiving power only to inverters 48 and 50 in latch 26 and to gates of transistors for transmission gates 25, 28, and 52. Thus leakage during power down is very low.

A power restore mode is used for coming out of the power down mode. In coming out of power-down, the voltage level of VDD is restored but input clock CLK is not yet started. In this condition, latch 26 still holds the last data due to transmission gate 52 being conductive, transmission gate 16 and 38 are conductive and transmission gate 40 is non-conductive.

After the VDD level has been restored, power restore pulse PR is generated which causes clock circuit 12 to switch latch clock signal CK from a low to high. The generation of power restore pulse PR and the consequent change in latch clock signal CK causes a change in six transmission gates; transmission gates 46, 40, 38, 28, 22, and 16. Transmission gate 28 becomes conductive to couple the output of latch 26 to the input of latch 18 while transmission gate 38 becomes non-conductive to prevent inverter 36 from interfering with the coupling of the output of latch 26 to the input of latch 18 due to transmission gate 40 becoming conductive. Transmission gate 22 becomes conductive to further couple the output of latch 26 to latch 24. Transmission gate 16 becomes non-conductive to avoid interfering with the coupling from the output of latch 26 to latch 24. The change in transmission gate 46 to be non-conductive prevents inverter 44 from interfering with inverter 42 receiving the latched signal from latch 26. Upon the termination of power restore pulse PR, transmission gate 38 becomes conductive and transmission gate 40 becomes non-conductive so latch 18 does not latch the output from latch 26. Transmission gate 22 becomes non-conductive with transmission gate 46 becoming conductive to cause latch 24 to latch the data from latch 26.

The power to latch 26 can either be maintained or removed after this operation which latched the last valid data in latch 24 from latch 26. Data from signal D is blocked from reaching inverter 23, which provides output signal Q, until the input CLK resumes, which occurs after power restore pulse PR has ended. Upon restoration of input clock CLK, transmission gate 16 becomes non-conductive and transmission gate 40 becomes conductive thereby latching signal D and beginning normal operation again with the output signal Q being updated in normal master/slave fashion. A benefit of this arrangement is that if a CLK input does not recover properly to a logic low but stays at a logic high due to a power glitch, for example, master latch 16 will latch the data and propagate to output Q. This makes the flip-flop independent of the clock state during restore.

While the invention has been described in the context of a preferred embodiment, it will be apparent to those skilled in the art that the present invention may be modified in numerous ways and may assume many embodiments other than that specifically set out and described above. For example, the combination of transmission gate and inverter in the feedback path of the latches have been depicted as two distinct circuit elements that would normally be thought of as being made up to transistors each. This combination of inverter and transmission gate can be achieved by integrating the four transistors into a serial stack with two P channel transistors in series connected to VDD and two P channel transistors connected in series between ground and the two P channel transistors.

Accordingly, it is intended by the appended claims to cover all modifications of the invention which fall within the true scope of the invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated circuit, comprising:
   a first latch circuit having a first terminal coupled to receive an input signal, a second terminal, and a power supply voltage terminal for receiving a first power supply voltage;
   a second latch circuit having a first terminal coupled to the second terminal of the first latch circuit, and a power supply voltage terminal for receiving the first power supply voltage; and
   a third latch circuit having a first terminal coupled to the second latch circuit, a second terminal coupled to the first latch circuit, and a power supply voltage terminal for receiving a second power supply voltage, the first power supply voltage being controlled separately from the second power supply voltage;
   wherein during a low power mode of the integrated circuit, the third latch circuit for storing a logic state corresponding to a logic state received at the first terminal of the third latch circuit, and the first power supply voltage is not provided to the first and second latch circuits while the second power supply voltage is provided to the third latch circuit.

2. The integrated circuit of claim 1, wherein the third latch circuit further comprises a control terminal for receiving a power down signal, wherein the power down signal is asserted prior to entering the low power mode from a normal mode for causing the third latch circuit to store the logic state.

3. The integrated circuit of claim 1, further comprising a transmission gate coupled between the second latch circuit and the third latch circuit, the transmission gate for coupling the second latch circuit to the third latch circuit in response to a power down signal being asserted.

4. The integrated circuit of claim 1, further comprising a transmission gate coupled between third latch circuit and the first latch circuit, the transmission gate for coupling the first latch circuit to the third latch circuit in response to a power restore signal, wherein the power restore signal is asserted prior to returning to normal mode from the low power mode.

5. The integrated circuit of claim 4, wherein the first and second latch circuits are coupled for receiving a latch clock signal, wherein the latch clock signal is provided as a logical function of the power restore signal and an input clock signal, wherein the power restore signal is asserted independent of the input clock signal.

6. The integrated circuit of claim 5, wherein the logical function includes a logical NOR function.

7. The integrated circuit of claim 1, wherein the second power supply voltage is reduced from a first level to a second level during a low power mode of the integrated circuit.

8. The integrated circuit of claim 1, wherein the second power supply voltage is not provided to the third latch circuit during a normal operating mode.

9. An integrated circuit, comprising:
- a first latch circuit having a first data terminal coupled to receive an input signal, a second data terminal, a control terminal for receiving a clock signal, and a power supply voltage terminal for receiving a first power supply voltage;
- a second latch circuit having a first data terminal coupled to the second data terminal of the first latch circuit, a control terminal for receiving the clock signal, and a power supply voltage terminal for receiving the first power supply voltage;
- a first transmission gate having a first terminal coupled to the first latch circuit, a control terminal for receiving a power restore signal, and a second terminal;
- a second transmission gate having a first terminal coupled to the second latch circuit, a control terminal for receiving a power down signal, and a second terminal; and
- a third latch circuit having a first data terminal coupled to the second terminal of the second transmission gate, a second terminal coupled to the second terminal of the first transmission gate, a control terminal for receiving the power down signal, and a power supply voltage terminal for receiving a second power supply voltage;
- wherein the power restore signal and the power down signal are asserted independent of the clock signal.

10. The integrated circuit of claim 9, wherein the power down signal is asserted prior to entering a low power mode of the integrated circuit to cause the third latch circuit to store a logic state corresponding to a logic state received at the first terminal of the third latch circuit.

11. The integrated circuit of claim 9, wherein the power restore signal is asserted to cause a logic state stored by the third latch circuit to be stored in both the first latch circuit and second latch circuit.

12. The integrated circuit of claim 9, wherein the third latch circuit comprises transistors having a relatively lower leakage current than transistors of the first and second latch circuits.

13. The integrated circuit of claim 9, wherein the third latch circuit comprises transistors having a relatively thicker gate dielectric than transistors of the first and second latch circuits.

14. The integrated circuit of claim 9, further comprising a logic gate having a first input terminal for receiving the power restore signal, a second input terminal for receiving an input clock signal, and an output signal for providing the clock signal.

15. The integrated circuit of claim 9, wherein the first power supply voltage is not provided to the first and second latch circuits during a low power mode.

16. In an integrated circuit having a normal operating mode and a low power mode, a method comprising:
- providing a first latch circuit for storing a logic state of an input signal in response to receiving a clock signal and a first power supply voltage;
- providing a second latch circuit for storing the logic state in response to receiving the clock signal and the first power supply voltage;
- asserting a power down signal to enter the low power mode;
- coupling a third latch circuit to the second latch circuit for storing the logic state in response to receiving the power down signal and a second power supply voltage;
- removing the first power supply voltage from the first and second latch circuits;
- initiating return to the normal operating mode from the low power mode;
- providing the first power supply voltage to the first and second latch circuits;
- asserting a power restore signal; and
- coupling the third latch circuit to the first latch circuit for restoring the logic state of the first latch circuit in response to the power restore signal.

17. The method of claim 16 wherein asserting the power down signal to enter the low power mode further comprises lowering the second power supply voltage from a first voltage level to a second voltage level.

18. The method of claim 16 wherein the power restore signal is asserted independent of the clock signal.

19. The method of claim 16 further comprising logically combining the power restore signal with an input clock signal to generate the clock signal.

20. The method of claim 19 wherein logically combining further comprises logically combining the power restore signal with the input clock signal with a NOR logic gate.

* * * * *

UNITED STATES PATENT AND TRADEMARK OFFICE
CERTIFICATE OF CORRECTION

| | |
|---|---|
| PATENT NO. | : 7,138,842 B2 |
| APPLICATION NO. | : 11/097659 |
| DATED | : April 1, 2005 |
| INVENTOR(S) | : Milind P. Padhye |

Page 1 of 1

It is certified that error appears in the above-identified patent and that said Letters Patent is hereby corrected as shown below:

In Column 8, Line 31, Claim 16:

Change "to the power" to --to a power--

Signed and Sealed this

Twentieth Day of May, 2008

JON W. DUDAS
*Director of the United States Patent and Trademark Office*

UNITED STATES PATENT AND TRADEMARK OFFICE
CERTIFICATE OF CORRECTION

PATENT NO. : 7,138,842 B2 Page 1 of 1
APPLICATION NO. : 11/097659
DATED : November 21, 2006
INVENTOR(S) : Milind P. Padhye It is certified that error appears in the above-identified patent and that said Letters Patent is hereby corrected as shown below:

In Column 8, Line 31, Claim 16:

Change "to the power" to --to a power--

This certificate supersedes the Certificate of Correction issued May 20, 2008.

Signed and Sealed this

Seventeenth Day of June, 2008

JON W. DUDAS
*Director of the United States Patent and Trademark Office*